(12) United States Patent
Van Den Eijnden et al.

(10) Patent No.: US 11,454,892 B2
(45) Date of Patent: *Sep. 27, 2022

(54) FLUID HANDLING STRUCTURE FOR LITHOGRAPHIC APPARATUS

(71) Applicant: ASML NETHERLANDS B.V., Veldhoven (NL)

(72) Inventors: Pepijn Van Den Eijnden, Eindhoven (NL); Cornelius Maria Rops, Waalre (NL); Theodorus Wilhelmus Polet, Geldrop (NL); Floor Lodewijk Keukens, Turnhout (BE); Gheorghe Tanasa, Eindhoven (NL); Rogier Hendrikus Magdalena Cortie, Weert (NL); Koen Cuypers, Lommel (BE); Harold Sebastiaan Buddenberg, Sittard (NL); Giovanni Luca Gattobigio, Eindhoven (NL); Evert Van Vliet, Eindhoven (NL); Nicolaas Ten Kate, Almkerk (NL); Mark Johannes Hermanus Frencken, Ittervoort (NL); Jantien Laura Van Erve, Eindhoven (NL); Marcel Maria Cornelius Franciscus Teunissen, Grathem (NL)

(73) Assignee: ASML NETHERLANDS B.V., Veldhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 17/315,650

(22) Filed: May 10, 2021

(65) Prior Publication Data

US 2021/0263424 A1 Aug. 26, 2021

Related U.S. Application Data

(63) Continuation of application No. 16/330,544, filed as application No. PCT/EP2017/071509 on Aug. 28, 2017, now Pat. No. 11,029,607.

(30) Foreign Application Priority Data

Sep. 12, 2016 (EP) .................................. 16188325

(51) Int. Cl.
*G03F 7/20* (2006.01)

(52) U.S. Cl.
CPC ...... *G03F 7/70341* (2013.01); *G03F 7/70525* (2013.01)

(58) Field of Classification Search
CPC ............ G03F 7/70341; G03F 7/70525; G03F 7/2012; G03F 7/70758
See application file for complete search history.

(56) References Cited

U.S. PATENT DOCUMENTS

| 8,218,126 B2 | 7/2012 | Steffens et al. |
| 2004/0207824 A1 | 10/2004 | Lof et al. |
(Continued)

FOREIGN PATENT DOCUMENTS

| CN | 1501173 | 6/2004 |
| CN | 101515118 | 8/2009 |
(Continued)

OTHER PUBLICATIONS

International Search Report and Written Opinion issued in corresponding PCT Patent Application No. PCT/EP2017/071509, dated Nov. 27, 2017.
(Continued)

*Primary Examiner* — Deoram Persaud
(74) *Attorney, Agent, or Firm* — Pillsbury Winthrop Shaw Pittman, LLP

(57) ABSTRACT

A fluid handling structure for a lithographic apparatus, the structure having: an aperture for the passage therethrough of a beam; a first part; and a second part, wherein the first and/or second part define a surface for the extraction of immersion fluid, relative movement between the first and
(Continued)

second parts is effective to change a position of fluid flow into or out of the surface relative to the aperture, and the first or second part has at least one through-hole for the fluid flow and the other of the first or second part has at least one opening for the fluid flow, the at least one through-hole and at least one opening being in fluid communication when aligned, the relative movement allowing alignment of the at least one opening with different ones of the through-hole to change the position of the fluid flow into or out of the surface.

20 Claims, 10 Drawing Sheets

(56) References Cited

U.S. PATENT DOCUMENTS

| | | |
|---|---|---|
| 2006/0119807 A1 | 6/2006 | Baselmans |
| 2007/0109512 A1 | 5/2007 | Ten Kate et al. |
| 2007/0109513 A1 | 5/2007 | Leenders et al. |
| 2007/0110213 A1 | 5/2007 | Leenders et al. |
| 2007/0296939 A1 | 12/2007 | Nishii |
| 2008/0002169 A1 | 1/2008 | Hasegawa |
| 2009/0147227 A1 | 6/2009 | Steffens et al. |
| 2010/0060868 A1 | 3/2010 | Tanasa |
| 2010/0085545 A1 | 4/2010 | Direcks et al. |
| 2010/0195067 A1 | 8/2010 | Nagasaka |
| 2010/0304310 A1 | 12/2010 | Sato |
| 2010/0313974 A1 | 12/2010 | Riepen et al. |
| 2011/0199593 A1 | 8/2011 | Riepen |
| 2011/0277859 A1 | 11/2011 | Cortie et al. |
| 2011/0292357 A1 | 12/2011 | Van Der Ham |
| 2012/0069309 A1 | 3/2012 | Willems et al. |
| 2013/0100425 A1 | 4/2013 | Riepen |
| 2013/0301017 A1 | 11/2013 | Derksen et al. |
| 2014/0285781 A1 | 9/2014 | Sato |
| 2014/0307235 A1 | 10/2014 | Sato |
| 2016/0077447 A1 | 3/2016 | Sato |

FOREIGN PATENT DOCUMENTS

| | | |
|---|---|---|
| CN | 101581887 | 11/2009 |
| CN | 102375348 | 3/2012 |
| CN | 102880016 | 1/2013 |
| CN | 202886841 | 4/2013 |
| CN | 105144342 | 12/2015 |
| EP | 1420298 | 5/2004 |
| EP | 1632991 | 3/2006 |
| JP | 2006165550 | 6/2006 |
| JP | 2007053329 | 3/2007 |
| JP | 2009-141359 | 6/2009 |
| JP | 2013-219351 | 10/2013 |
| JP | 2014146798 | 8/2014 |
| JP | 2014175455 | 9/2014 |
| JP | 2015076521 | 4/2015 |
| JP | 2015515738 | 5/2015 |
| KR | 10-2009-0029195 | 3/2009 |
| TW | 201346989 | 11/2013 |
| TW | 201435517 | 9/2014 |
| WO | 9949504 | 9/1999 |
| WO | 2004114380 | 12/2004 |
| WO | 2014104107 | 7/2014 |

OTHER PUBLICATIONS

Taiwanese Office Action issued in corresponding Taiwanese Patent Application No. 106131155, dated Aug. 10, 2018.
Notification of Reasons for Refusal dated Mar. 17, 2021 issued in corresponding Korean Patent Application No. 10-2021-7001688 with English translation (11 pgs.).
Office Action dated Feb. 18, 2020 issued in corresponding Japanese Patent Application No. JP 2019-513447 with English translation.
English translation of Office action dated Jul. 2, 2020 issued in corresponding Chinese Patent Application No. 201780056049 (8 pgs.).
Office Action dated May 4, 2020 issued in corresponding European Patent Application No. EP 17755209.9.
Japanese Office Action issued in corresponding Japanese Patent Application No. 2020-145276, dated Jun. 28, 2021.

FLUID HANDLING STRUCTURE FOR LITHOGRAPHIC APPARATUS

This application is a continuation of pending U.S. patent application Ser. No. 16/330,544, filed Mar. 5, 2019, which is the U.S. national phase entry of PCT patent application no. PCT/EP2017/071509, which was filed on Aug. 28, 2017, which claims the benefit of priority of European patent application no. 16188325.1, which was filed on Sep. 12, 2016, and which is incorporated herein in its entirety by reference.

FIELD

The present description relates to a fluid handing structure and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in an immersion liquid having a relatively high refractive index, e.g. water, so as to fill a space between the final element of the projection system and the substrate. In an embodiment, the immersion liquid is ultra-pure water, although another immersion liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

In an immersion apparatus, immersion fluid is handled by a fluid handling structure. In an embodiment the fluid handling structure may supply immersion fluid and may be referred to as a fluid supply system. In an embodiment the fluid handling structure may at least partly confine immersion fluid to a region and may be referred to as a fluid confinement system. In an embodiment the fluid handling structure may provide a barrier to immersion fluid and thereby be referred to as a barrier member. In an embodiment the fluid handling structure creates or uses a flow of fluid, e.g. a flow of gas, for example to help in controlling the flow and/or the position of the immersion fluid. The flow of gas may form a seal to confine the immersion fluid.

However, use of a fluid handling structure may lead to defects forming on a top surface of the substrate. Defects can be caused by a droplet of immersion fluid being left behind after the substrate passes under the fluid handling structure. Defects on the surface of the substrate may lead to errors on the surface of the substrate which can reduce yield. Defects may mean watermarks in particular, or may mean other defects which may occur on the surface of the substrate. Leaving immersion liquid behind on a support table supporting the substrate or an object on the support table over which the fluid handling structure passes is considerable too.

SUMMARY

It is desirable, for example, to provide a fluid handling structure in which immersion fluid loss is reduced.

According to an aspect of the invention, there is provided a fluid handling structure configured to confine immersion fluid to a region of a lithographic apparatus, the fluid handling structure comprising: an aperture formed therein for the passage there through of a projection beam through the immersion fluid; a first part; and a second part; and wherein at least one of the first part and the second part define a surface adapted for the extraction of the immersion fluid from the region; and wherein the fluid handling structure is adapted to provide a fluid flow into or out of the surface of the fluid handling structure and wherein movement of the first part relative to the second part is effective to change a position of the fluid flow into or out of the surface relative to the aperture, and wherein one of the first part and second part comprises at least one through-hole for the fluid flow there through and the other of the first part and second part comprises at least one opening for the fluid flow there through, the at least one through-hole and at least one opening being in fluid communication when aligned, the movement allowing alignment of the at least one opening with one of the at least one through-hole thereby to change the position of the fluid flow into or out of the surface relative to the aperture.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
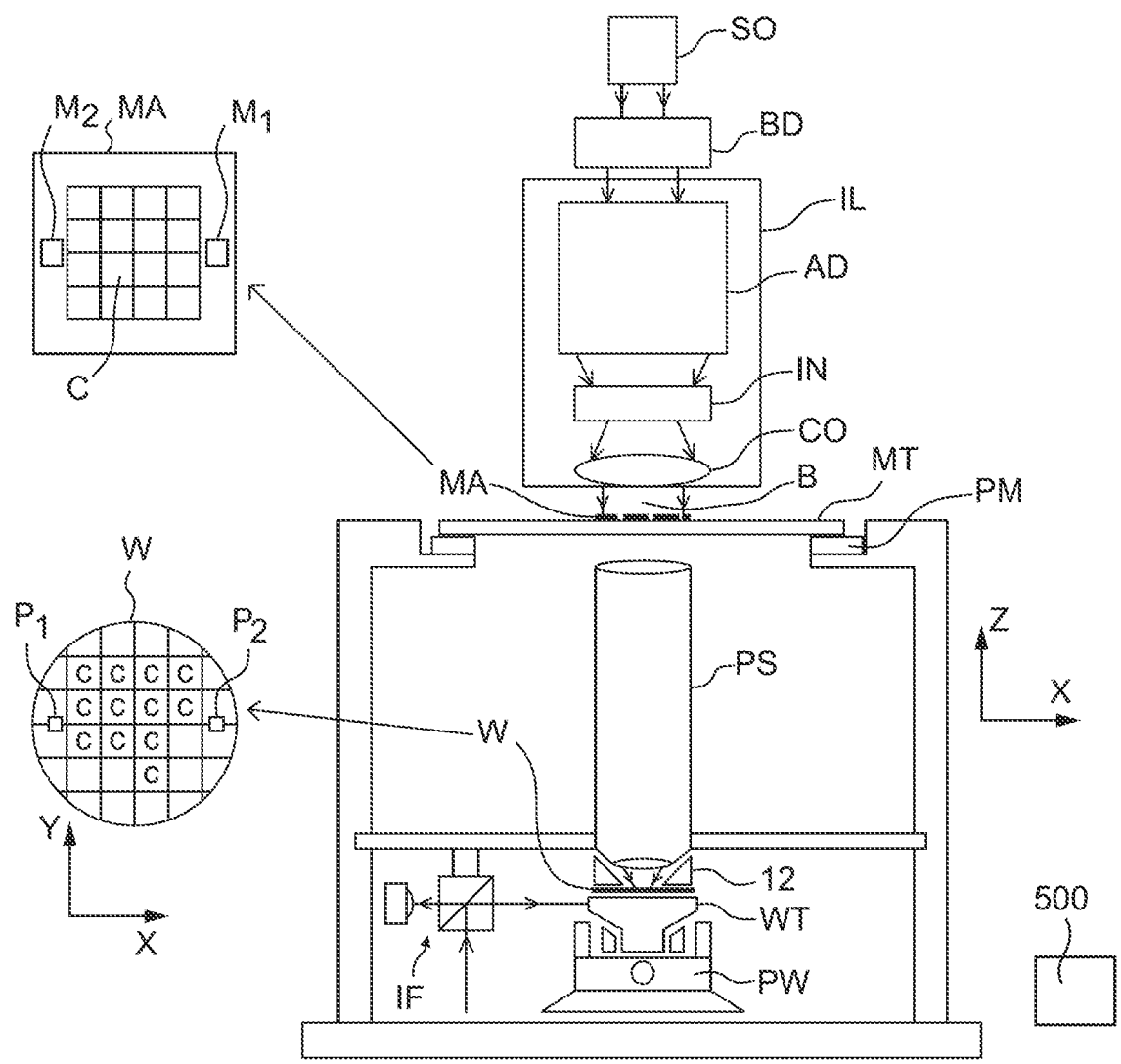
FIG. 1 depicts a lithographic apparatus according to an embodiment of the invention.

FIG. 1 schematically depicts a lithographic apparatus according to one embodiment of the invention. The apparatus comprises:

a. an illumination system (illuminator) IL configured to condition a projection beam B (e.g. UV radiation or DUV radiation);

b. a support structure (e.g. a mask table) MT constructed to support a patterning device (e.g. a mask) MA and connected to a first positioner PM configured to accurately position the patterning device MA in accordance with certain parameters;

c. a support table, e.g. a sensor table to support one or more sensors or a support table WT constructed to hold a substrate (e.g. a resist-coated substrate) W, connected to a second positioner PW configured to accurately position the surface of the table, for example of a substrate W, in accordance with certain parameters; and d. a projection system (e.g. a refractive projection lens system) PS configured to project a pattern imparted to the projection beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more support tables or a combination of one or more support tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a support table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or supports) which may be used in parallel in a similar manner to substrate, cleaning, sensor and/or measurement tables.

Referring to FIG. 1, the illumination system IL receives a radiation beam from a source SO or radiation. The source SO and the lithographic apparatus may be separate entities, for example when the source SO is an excimer laser. In such cases, the source SO is not considered to form part of the lithographic apparatus and the radiation beam is passed from the source SO to the illumination system IL with the aid of a beam delivery system BD comprising, for example, suitable beam directing mirrors and/or a beam expander. In other cases the source SO may be an integral part of the lithographic apparatus, for example when the source SO is a mercury lamp. The source SO and the illumination system IL, together with the beam delivery system BD if required, may be referred to as a radiation system.

The illumination system IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as an integrator IN and a condenser CO. The illumination system IL may be used to condition the radiation beam, to have a desired uniformity and intensity distribution in its cross-section. Similar to the source SO, the illumination system IL may or may not be considered to form part of the lithographic apparatus. For example, the illumination system IL may be an integral part of the lithographic apparatus or may be a separate entity from the lithographic apparatus. In the latter case, the lithographic apparatus may be configured to allow the illumination system IL to be mounted thereon. Optionally, the illumination system IL is detachable and may be separately provided (for example, by the lithographic apparatus manufacturer or another supplier).

The projection beam is incident on the patterning device MA, which is held on the support structure MT, and is patterned by the patterning device MA. Having traversed the patterning device MA, the projection beam passes through the projection system PS, which focuses the beam onto a target portion C of the substrate W. With the aid of the second positioner PW and position sensor IF (e.g. an interferometric device, linear encoder or capacitive sensor), the support table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the projection beam, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the support table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing immersion liquid between a final element of the projection system PS and the substrate can be classed into three general categories. These are the bath type arrangement, the so-called localized immersion system and the all-wet immersion system. In a bath type arrangement substantially the whole of the substrate W and optionally part of the support table WT is submersed in a bath of immersion liquid. In the all-wet immersion system the whole top surface of the substrate is covered in immersion liquid.

Figure 2:
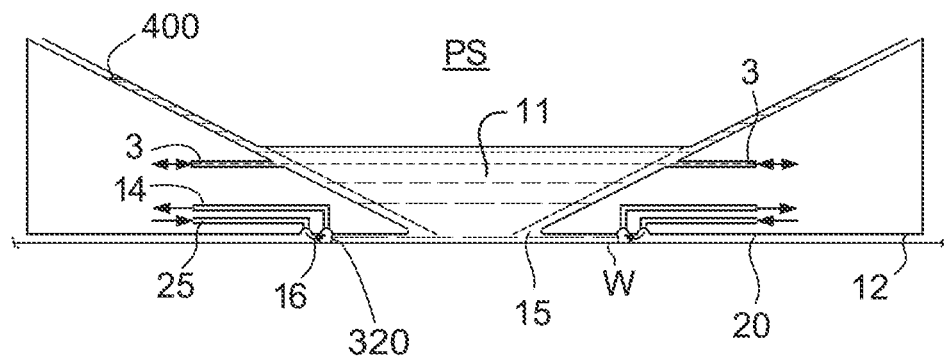
FIG. 2 depicts a fluid handling structure for use in a lithographic projection apparatus.
Figure 3:
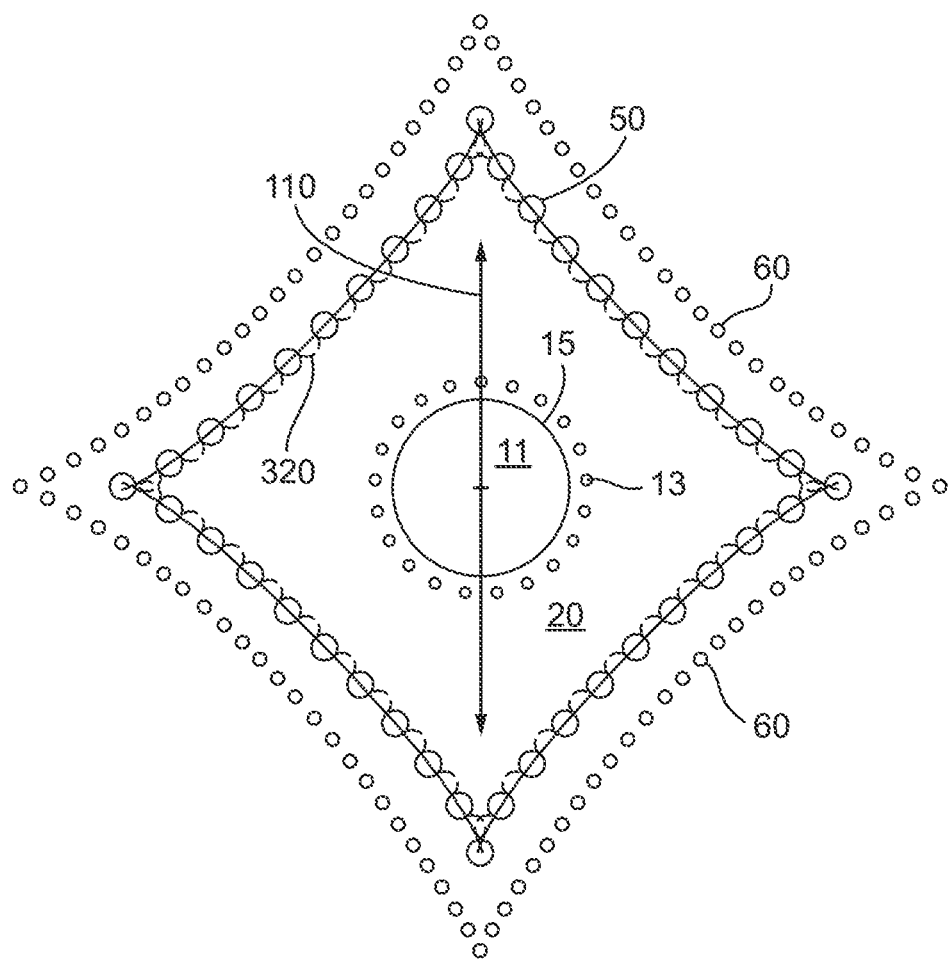
FIG. 3 is a side cross sectional view that depicts a further fluid handling structure.

A localized immersion system uses a liquid supply system in which immersion liquid is only provided to a localized area of the substrate. The region filled by immersion liquid is smaller in plan than the top surface of the substrate and the region filled with immersion liquid remains substantially stationary relative to the projection system PS while the substrate W moves underneath that area. FIGS. 2 and 3 show different fluid handling structure which can be used in such a system. A sealing feature is present in a bottom surface 20 to seal immersion liquid to the localized area. One way which has been proposed to arrange for this is disclosed in PCT patent application publication no. WO 99/49504.

An arrangement which has been proposed is to provide the fluid handling structure with a structure which extends along at least a part of a boundary of a space between the final element of the projection system PS and the support table WT. Such an arrangement is illustrated in FIG. 2.

FIG. 2 schematically depicts a localized fluid handling structure 12. The fluid handling structure 12 extends along at least a part of a boundary of the space 11 between the final element of the projection system PS and the support table WT or substrate W. (Please note that reference in the following text to surface of the substrate W also refers in addition or in the alternative to a surface of the support table WT or an object, such as a sensor, on the support table WT, unless expressly stated otherwise.) The fluid handling structure 12 is substantially stationary relative to the projection system PS in the XY plane though there may be some relative movement in the Z direction (in the direction of the optical axis). In an embodiment, a seal is formed between the fluid handling structure 12 and the surface of the substrate W and may be a contactless seal such as a gas seal (such a system with a gas seal is disclosed in European patent application publication no. EP 1,420,298 A) or liquid seal.

The fluid handling structure 12 at least partly confines immersion liquid in the space 11 between the final element of the projection system PS and the substrate W. A contactless seal to the substrate W may be formed around the image field of the projection system PS so that immersion liquid is confined within the space 11 between the substrate W surface and the final element of the projection system PS and more generally to a region including between the fluid handling structure 12 and the substrate W adjacent the space 11. The space 11 is at least partly formed by the fluid handling structure 12 positioned below and surrounding the final element of the projection system PS. Immersion liquid is brought into the space 11 below the projection system PS and within the fluid handling structure 12 by one of liquid openings 3. The immersion liquid may be removed by another of liquid openings 3. The immersion liquid may be brought into the space 11 through at least two liquid openings 3. Which of liquid openings 3 is used to supply the immersion liquid and optionally which is used to remove the immersion liquid may depend on the direction of motion of the support table WT. The fluid handling structure 12 may extend a little above the final element of the projection system PS. The liquid level rises above the final element so that a buffer of immersion liquid is provided. In an embodiment, the fluid handling structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The immersion liquid may be confined in the space 11 by a gas seal 16 which, during use, is formed between the bottom surface 20 of the fluid handling structure 12 and the surface of the substrate W. The surface 20 faces the substrate W and a seal is formed between that surface 20 and the substrate W. An aperture 15 is formed in the fluid handling structure 12 for the passage there through of the projection beam through immersion liquid in the space 11. The gas seal 16 is formed by gas. The gas in the gas seal 16 is provided under pressure via inlet 25 to the gap between the fluid handling structure 12 and substrate W. The gas is extracted via outlet 14. The overpressure on the gas inlet 25, vacuum level on the outlet 14 and geometry of the gap are arranged so that there is a high-velocity gas flow inwardly that confines the immersion liquid. The force of the gas on the immersion liquid between the fluid handling structure 12 and the substrate W confines the immersion liquid in the space 11. The inlets/outlets may be annular grooves which surround the space 11. The annular grooves may be continuous or discontinuous. The flow of gas is effective to confine the immersion liquid in the space 11. Such a system is disclosed in United States patent application publication no. US 2004-0207824, which is hereby incorporated by reference in its entirety. In an embodiment, the fluid handling structure 12 does not have the gas seal 16.

FIG. 3 illustrates schematically features formed in the surface 20 of an alternative fluid handling structure 12. The surface 20 includes features to adapt the surface 20 for the extraction of the immersion liquid from the region. FIG. 3 illustrates schematically and in plan meniscus controlling features of a fluid handling structure 12 which may have outlets using the gas drag principle and to which an embodiment of the present invention may relate. The features of a meniscus controlling feature are illustrated which may, for example, replace the meniscus controlling features depicted by the gas seal 16, provided by the inlet 15 and the outlet 14 in FIG. 2. The meniscus controlling feature of FIG. 3 is a form of extractor, for example a dual phase extractor. The meniscus controlling feature comprises a plurality of discrete openings 50 in the surface 20 of the fluid handling structure 12. Thus, the surface 20 is adapted for the extraction of immersion fluid from the region. Each discrete opening 50 is illustrated as being circular, though this is not necessarily the case. Indeed, the shape is not essential and one or more of the discrete openings 50 may be one or more selected from: circular, elliptical, rectilinear (e.g. square, or rectangular), triangular, etc., and one or more openings may be elongate.

Radially inwardly of the discrete openings 50 and also in the surface 20 of the fluid handling structure 12 are a plurality of inlet openings 13. Immersion liquid is provided through inlet openings 13 to the region to which immersion liquid is provided. Inlet openings 13 surround the space 11 which is bounded by the aperture 15 formed in the fluid handling structure 12.

There may be no meniscus controlling features radially inwardly of the openings 50. The meniscus 320 is pinned between the discrete openings 50 with drag forces induced by gas flow into the discrete openings 50. A gas drag velocity of greater than about 15 m/s, desirably about 20 m/s is sufficient. The amount of splashing or leaking of fluid from the substrate W may be reduced, thereby reducing evaporation of fluid and thereby reducing thermal expansion/contraction effects.

Various geometries of the bottom of the fluid handling structure are possible. For example, any of the structures disclosed in U.S. patent application publication no. US 2004-0207824 or U.S. patent application publication no. US 2010-0313974 could be used in an embodiment of the present invention. An embodiment of the invention may be applied to a fluid handling structure 12 which has any shape in plan, or has a component such as the outlets arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star, for example, as depicted in FIG. 3.

Known lithographic apparatus may comprise a fluid handling structure 12 comprising a gas knife. The gas knife can be used to help confine immersion fluid to the space 11. Therefore, the gas knife can be useful in preventing immersion fluid from escaping from the space 11, which could later lead to defects. Providing a strong gas knife is useful in preventing film pulling. This is because a strong gas knife will reduce or prevent the amount of immersion fluid which is dragged behind the fluid handling structure 12. Additionally a strong gas knife may break up the film faster to reduce the amount of immersion fluid left behind the fluid handling structure 12.

The fluid handling structure 12 is configured to confine immersion fluid to a region and comprises a gas knife system. The gas knife system may be configured to generate a gas knife in use. The gas knife may be radially outward of the space 11 and may contribute to confining the immersion fluid. The gas knife system comprises passages each having an exit 60. The gas knife may be formed by gas exiting the exits 60 in use. The exits 60 form at least one side of a shape in plan view. The exits 60 may form at least one, multiple or all the sides of the shape in plan view. For example, the exits 60 may form the sides of a four pointed star as shown in FIG. 3. The shape may have a plurality of sides, for example any appropriate number of sides may be provided, e.g. 3, 4, 5, 6, 7, 8, 9, 10 or more. As described above, the exits 60 may form the sides of any shape and this is not limiting. FIG. 3 depicts the scanning direction 110 as in-line with two of the points of the four point star but this may not be the case. The shape formed by the gas knife may be aligned with the scanning direction 110 in any selected orientation.

In the embodiment of FIG. 3 it can be seen that there is fluid flow out of the surface 20 through liquid openings 13 (immersion liquid) and through exits 60 (a flow of gas to form a gas knife). There is also a flow of fluid into the surface 20 (a mixture of gas and immersion liquid) into discrete openings 50.

In an embodiment, the fluid handling structure 12 is adapted to provide a fluid flow into or out of the surface 20 (e.g. flow out of fluid openings 13, flow into discrete openings 50, flow out of exits 60). The fluid handling structure 12 is adapted to change position of the fluid flow into or out of the surface 20 relative to the aperture 15, for example in the radial direction.

The faster the relative movement between the fluid handling structure 12 and the substrate W, the more likely leaking of immersion liquid is to occur. However, it is desirable to maximise the relative speed between the fluid handling structure 12 and the substrate W in order to maximise throughput of the apparatus. Therefore, it is desirable to increase the maximum relative speed between the fluid handling structure 12 and the substrate W without allowing any immersion liquid or only small amounts of immersion liquid to be left behind on the substrate W. By changing the position of a fluid flow relative to the aperture 15, it is possible to increase the relative speed of the substrate W to the projection system PS which is achievable before immersion liquid is left behind on the surface of the substrate W.

In an embodiment, the fluid flow(s) associated with a meniscus controlling feature can be moved in the same direction as the substrate W, thereby reducing the relative velocity between the flows associated with the meniscus controlling feature and the substrate W. Thus, in an embodiment the change in position of the fluid flow means that the relative speed of the position on which the fluid flow impinges on the surface of the substrate W has a reduced velocity compared to the case where there is no relative movement and the position of the fluid flow into or out of the surface relative to the aperture 15. This reduction in relative velocity means that liquid loss is less likely and/or that a higher speed of the substrate W relative to the projection system PS is usable before immersion liquid is left behind on the substrate W.

In an embodiment allowing the change of position of the fluid flow into or out of the surface 20 relative to the aperture allows for the alignment of the shape, in plan, of fluid flows associated with a meniscus controlling feature in a particular direction. For example, the shape, in plan, may be a cornered shape and a corner of the shape may be turned always to face the oncoming substrate which is optimal in terms of confining immersion liquid. Specifically, such a system might allow the alignment of the corners of the overall shape, in plan, made by the openings 50 of FIG. 3 with the actual movement direction of the substrate W relative to the projection system PS, rather than the fixed alignment with the scanning direction 110 as illustrated in FIG. 3. This would allow a greater speed of non-scanning movements of the substrate W without liquid loss than is possible with the fixed fluid handling structure 12 of FIG. 3. This thus allows alignment of features for confining the immersion liquid to the region to be optimally aligned relative to the direction of travel of the substrate W under the fluid handling structure 12.

In an embodiment the change of position allows several passes of a fluid flow over a particular region of the substrate W such that any immersion liquid which does manage to pass a meniscus controlling feature closer to the aperture 15 can be contained by the fluid flow.

A change in position of the fluid flow is achieved by allowing a first part of the fluid handling structure 12 to move relative to a second part of the fluid handling structure 12. The movement may be controlled by controller 500. The change in position is achieved by arranging for one of the first part and second part to comprise at least one through-hole for the fluid flow there through. The other of the first part and second part comprises at least one opening for the fluid flow there through. The at least one through-hole and at least one opening are in fluid communication when they are aligned. By moving the first part and second part relative to one another, the at least one opening will align with a different one of the at least one through hole. In this way the fluid flow can be selected to be out of different of the at least one through-holes, thereby to change the position of the fluid flow into or out of the surface relative to the aperture. Such an arrangement is advantageous because, without substantially increasing the volume of the fluid handling structure 12, it is possible efficiently to adapt the fluid handling structure 12 to allow a fluid flow into or out of the surface 20 to change its position relative to the aperture 15. Additionally any support for the fluid handling structure 12 for holding the fluid handling structure 12 in position relative to the projection system PS can be attached to the first part of the fluid handling structure 12 which can be arranged not to move relative to the projection system PS. This greatly simplifies supporting of the fluid handling structure 12 compared to the case where the whole fluid handling structure 12 rotates or moves in order to change the position of a fluid flow relative to the projection system PS. Additionally instead of moving the whole of the fluid handling structure 12, by just moving a part of the fluid handling structure 12, the overall mass of the moving part is lower than the case where the whole fluid handling structure 12 is moved. Generally a chamber with a larger cross-sectional area than the opening is provided in the first or second part which comprises the at least one opening. The chamber smooths the flow through the opening by absorbing pressure variations. In preferred embodiments the chamber is provided in the non moving part so that advantageously the part which defines the chamber does not need to move thereby reducing moving mass. The part with the at least one through-hole in it may be kept relatively thin and thereby keep its mass low, meaning that actuation for the movement is simpler.

In an embodiment the movement of the first part relative to the second part includes a rotational movement of the first part relative to the second part. In an embodiment the movement of the first part relative to the second part includes a translational movement of the first part relative to the second part.

Figure 4:
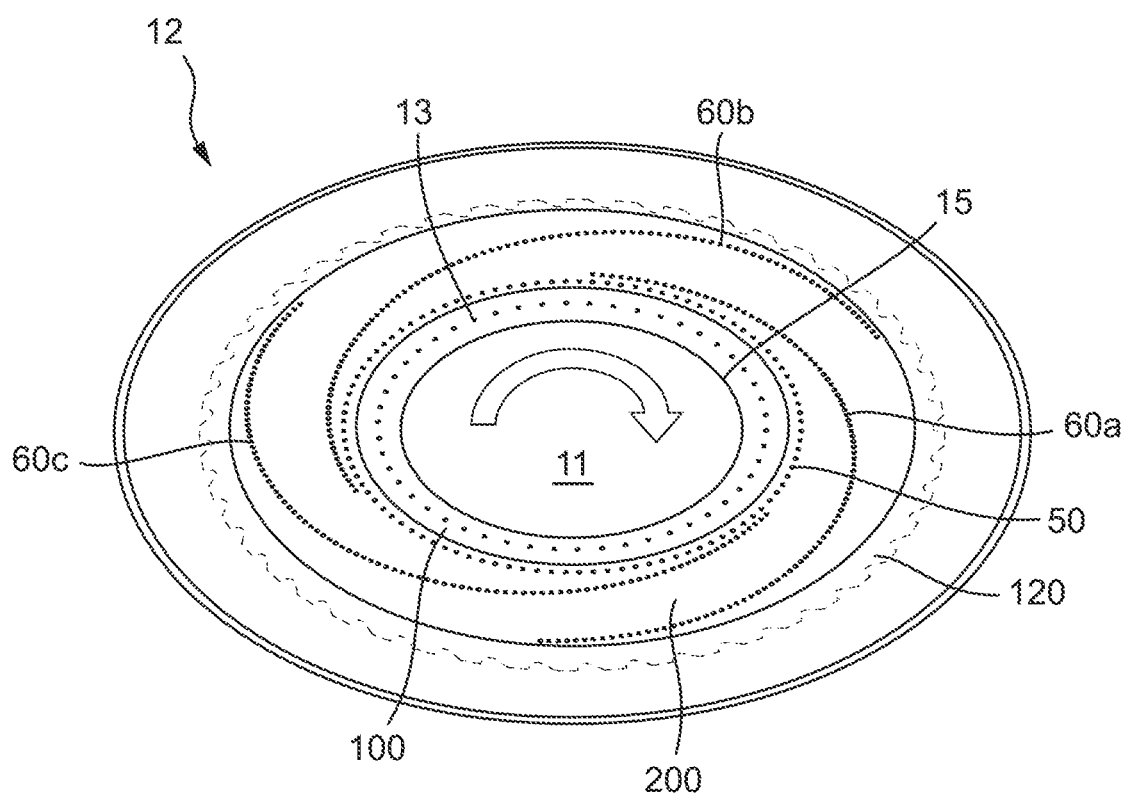
FIG. 4 is a perspective view of the bottom surface of a fluid handling structure.

An embodiment of the present invention will now be described by way of example only with reference to FIG. 4. Various openings, inlets, exits etc. for the flow of fluid into/out of the fluid handling structure 12 are described in this and other embodiments. The openings, inlets, exits etc. may be in the form of one or more openings, inlets, exits etc. with any cross-sectional shape and in any number. For example the openings, inlets, exits etc. may be in the form of a single slit instead of separate holes as illustrated. FIG. 4 is a schematic perspective diagram of the surface 20 of the fluid handling structure 12. The fluid handling structure of FIG. 4 is the same as that of FIG. 3 except as described below. The fluid handling structure 12 comprises discrete openings 50 and exits 60*a, b, c* with the same function as the discrete openings 50 and exits 60 of FIG. 3. The discrete openings 50 in the surface 20, which are for the extraction of the immersion liquid, are closer to the aperture 15 than the exits 60.

The fluid handling structure 12 comprises a first part 100 and a second part 200. The first part 100 is mounted substantially stationary relative to the projection system PS. The second part 200 sits in a groove formed in the bottom of the first part 100 such that the surface 20 (which is the under surface of the fluid handling structure 12) is formed partly by the first part 100 and partly by the second part 200. Bottom surfaces of the first part 100 and second part 200 are substantially co-planar surfaces and together define the surface 20 through which immersion liquid is extracted.

The fluid handling structure 12 is adapted such that the second part 200 may rotate relative to the first part 100. The rotational movement is around a central axis of the fluid handling structure 12. In an embodiment the central axis of the fluid handling structure 12 is coincident with a central axis of the projection system PS of the lithographic apparatus.

The exits 60 are in the form of outlet openings in the surface 20. The fluid flow out of the exits 60a, b, c passes out of the surface 20 along at least one line, in plan because the exits 60a, b, c are arranged along a line, in plan. The fluid (e.g. gas) flow of out exits 60a, b, c is in the form of a gas knife. In the embodiment illustrated in FIG. 4, the exits 60a, b, c form three lines, in plan. However, the present embodiment is not limited to three lines and any number of lines may be formed by the exits 60a, b, c.

The lines of exits 60a, b, c are formed such that the fluid flow out of them is effective to manipulate droplets of the immersion liquid towards the aperture 15 due to the change in position of the fluid flow. This is illustrated schematically in FIG. 5 which is a plan view of the surface 20 illustrated in FIG. 4 except that the exits 60 are formed into five blade shaped lines, in plan (60a, 60b, 60c, 60d, 60e).

A droplet of immersion liquid 62 is illustrated being pushed along by the gas flow out of the line of exits 60e and swept towards the discrete openings 50. The rotation of second part 200 acts like a diode comprising a plurality of gas knives. The gas knives bulldoze all immersion liquid which escapes radially inner confinement features back radially inwardly into the region where immersion liquid is supposed to be. The immersion liquid can then be extracted by the extraction features such as the discrete openings 50.

The lines of exits 60a-e extend in the circumferential direction and also get progressively further from the aperture 15 along their length. The second part 200 is rotated such that at a given fixed radial position relative to the projection system PS or aperture 15 as a given line passes that radial position at that fixed radial position moves closer to the projection system PS and aperture 15. The direction of rotation of the second part 200 relative to the first part 100 is illustrated by arrow 63. The movement of the line relative to the droplet 62 (which would be on the substrate W under the fluid handling structure 12) would result in the droplet 62 moving in direction 64 towards the aperture 15.

The movement of the droplet 62 is due to the movement of the position the fluid flow exiting the exits 60e relative to the aperture 15.

As the droplet 62 moves towards the aperture 15, it will be extracted through one of the discrete openings 50. Even if the droplet 62 moves past the line of exits 60e, it will then be caught by the next line of exists 60d which will exert a force on the droplet 62 in the same way as described above in relation to the force exerted on the droplet 62 by the line of exit 60e. In this way any droplets of immersion liquid which move past the discrete openings 50 in the direction away from the aperture 15 are swept by the fluid flow out of the line of exits 60a, b, c, d, e back towards the openings 50.

Figure 5:
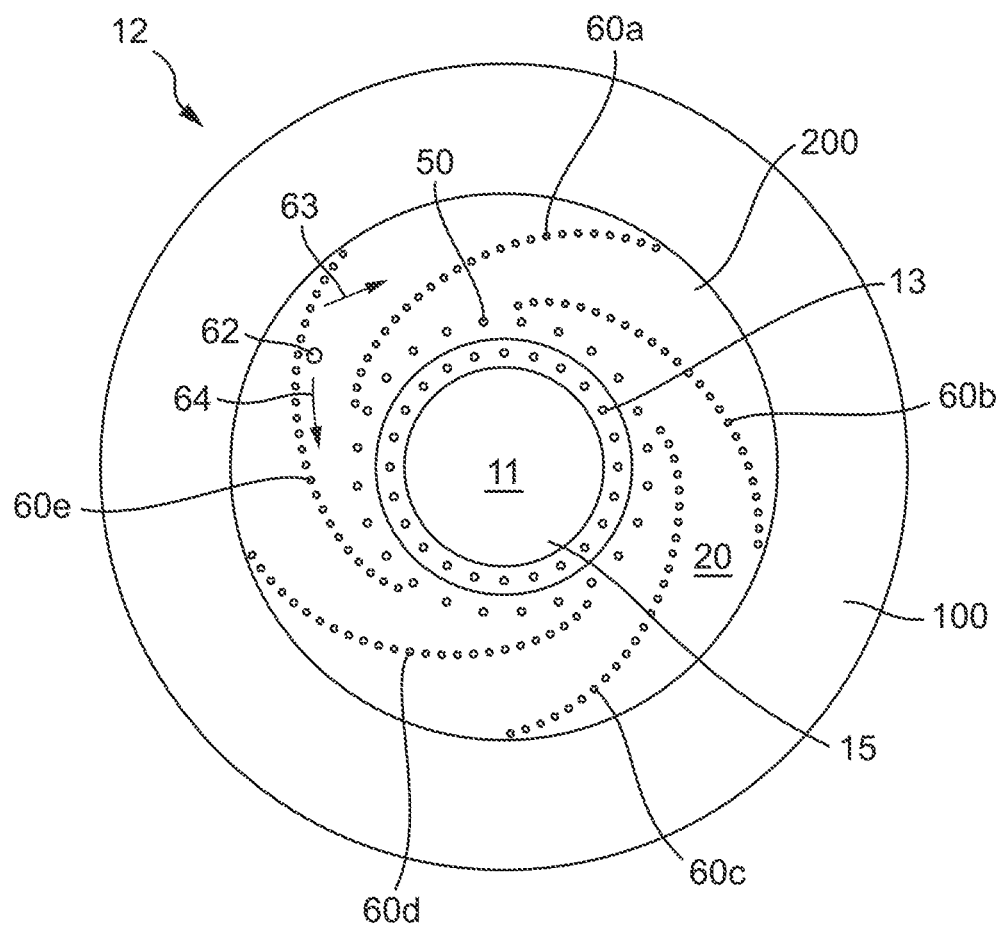
FIG. 5 is a plan view of the bottom surface of a fluid handling structure.

As illustrated in FIGS. 4 and 5, the lines of exits 60a-e may not be straight and may be for example curved. The lines of exists 60a-e may or may not overlap in the circumferential direction.

Although not illustrated, openings 13 may be provided in the surface 20 in the first part 100 adjacent to the aperture 15.

As illustrated in FIG. 5, liquid openings 13 are present in the first part 100 radially inwardly of the second part 200. The liquid openings 13 are optional in this embodiment and have the same function as the liquid openings 13 in the fluid handling structure 12 of FIG. 3.

The second part 200 is frictionlessly suspended by the first part 100. The second part 200 may rotate relative to the first part 100 at a speed of, for example, between 0.1 and 100 Hz, preferably between 1 and 10 Hz, say a few Hertz. If the rotation speed is kept constant, there are advantageously no acceleration or deceleration forces introduced to the apparatus.

Figure 6:
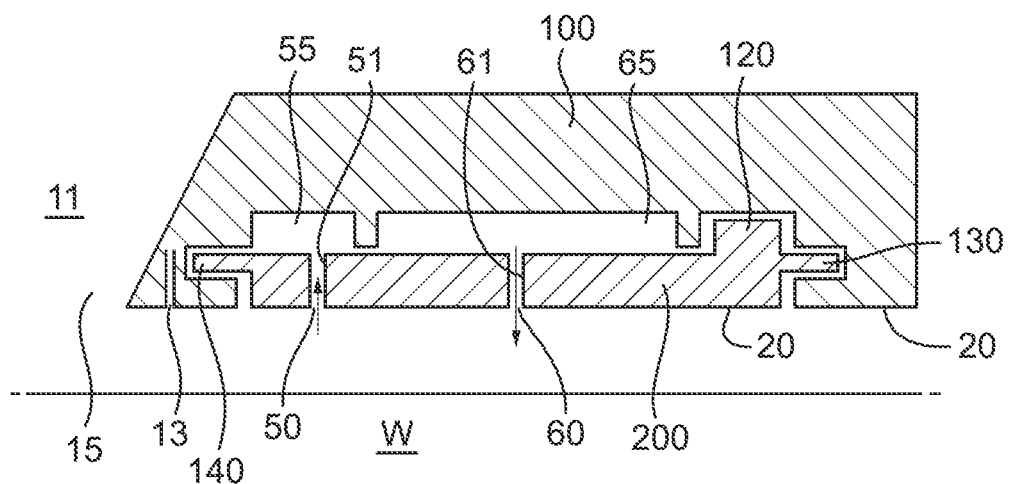
FIG. 6 is a side cross-sectional view that depicts one half of the fluid handling structure of FIG. 4 or 5.

The movement of the second part 200 relative to the first part 100 may be driven pneumatically or hydraulically. FIG. 6 is a cross section of the fluid handling structure 12 of FIGS. 4 and 5. Veins 120 are illustrated for pneumatic or hydraulic actuation. Pneumatic actuation may be using the same gas as the gas used in the exit 60, for example carbon dioxide. A hydraulic actuation may use the same liquid as the immersion liquid, for example by pumping immersion liquid past veins 120. Other ways of moving the second part 200 relative to the first part 100 include using a (servo/stepper) motor, optionally in combination with gears, a belt or a rod. Using a belt or a rod to transmit motion from a motor to the second part 200 may be advantageous because it is then possible to place the motor at a location distant from the second part 200. This may be particularly advantageous in cases where the fluid handling structure 12 has a limited volume. A rotation sensor (not depicted in the figure) detecting the speed of rotation of the first part 100 relative to the second part 200 may be provided. A flow sensor (not depicted in the figure) measuring the speed of immersion liquid/gas during the rotation may be provided. The sensors may be used by a controller 500 to control the rotational speed of the second part 200 relative to the first part 100 in a closed loop.

As illustrated in FIG. 6, in an embodiment an outer bearing 130 and an inner bearing 140 are provided between the first part 100 and the second part 200. The inner bearing 140 may be a liquid bearing, for example using the same liquid as is in the space 11. The outer bearing 130 may be a gas bearing, for example using the same gas as the gas exiting exit 60. Only one bearing 130, 140 may be provided and the bearing may be any type of contactless and/or frictionless bearing including pneumatic and hydraulic as described above.

Removing the inner bearing 140 and only having an outer bearing 130 may be advantageous because more space is available at the outer side of the second part 200 than on the inner side. As a result the size of the rotating second part 200 may be reduced as no space is required for the inner bearing 140. This would lead to a smaller shielding gas (e.g. carbon dioxide) footprint because of the smaller radius of the rotating second part 200. Additionally this would mean that fewer exits 60 are required. However, the stiffness of the second part 200 might need to be increased compared to the case where an inner bearing 140 is provided.

The embodiments of FIGS. 4-6 illustrate the discrete openings 50 being provided in the second part 200. However, this need not be the case and in an embodiment the discrete openings 50 are provided in the first part 100. The arrangement of the embodiments of FIGS. 4-6 may be advantageous as the relative speed between the discrete openings 50 and the substrate W under the fluid handling structure 12 is lower meaning that lower forces act on the meniscus due to the relative motion between the openings 50 and the substrate W. As a result liquid loss from the region past the discrete openings 50 can be reduced. Additionally the shape the discrete openings 50 make, in plan, could be a shape other than a circle. For instance, it might be desirable to have the discrete openings in a cornered shape with corners aligned with the scan direction, such as is illustrated in FIG. 3. However, from the view point of minimising the size of the fluid handling structure 12, the shape made by the discrete openings 50 in plan is desirably a circle, as illustrated, whether or not the discrete openings 50 are in the first part 100 or second part 200.

As illustrated in FIG. 6, an annular chamber 55, 65 is provided for each of the fluid flows out of the second part 200. For instance, in the embodiment of FIG. 6, an annular chamber 55 is provided which is in fluid communication with the discrete openings 50 via through holes 51 in the second part 200. An under pressure is provided in the chamber 55. This under pressure induces a flow of fluid (immersion liquid and gas) through the discrete openings 50. Similarly an annular chamber 65 is provided above the exits 60 and in fluid communication with the exits 60 via through holes 61 in the second part 200. An over pressure of gas is supplied to the annular chamber 65. Because the annular chamber 65 is in fluid communication with all of the exits 60a-e, this provides an even flow of gas out of all of the exits 60a-e.

The chambers 55 and 65 can be seen as being openings in the first part 100 which are in fluid communication with the through holes 51, 61 in the second part 200. In this way the annular chambers 55, 65 are in fluid communication with the discrete openings 50 and exits 60 in the surface 20. The annular chamber 55 is a relatively large chamber compared to the combined volume of the through holes 51. This allows pressure fluctuations present due to immersion liquid passing through the through holes 51, to be evened out. A similar principle applies to annular chamber 65. However, additionally the large surface area of the opening in the first part 100 corresponding to the annular chamber 65 means that each of the exits 60a-e in the surface 20, which are at different radial positions relative to the aperture 15 are in fluid communication with the one annular chamber 65.

In an embodiment centrifugal forces can be used to separate the immersion liquid and gas in the annular chamber 55. This is beneficial because this reduces disturbance forces and evaporation of immersion liquid in the annular chamber 55.

The second part 200 may be made by turning instead of milling. This is advantageous because turning is less expensive and faster and also more accurate than milling. Therefore, the manufacturing cost is reduced compared to the fluid handling structure 12 of FIG. 3 which is typically made by milling.

In an embodiment the second part 200 is dismountable from the first part 100 in order to aid in cleaning and/or upgrading and/or to change the pattern of the discrete openings 50 and/or exits 60 and/or any other features which may be on the surface 20 of the second part 200.

Although not illustrated, outer extraction holes may be formed in the first part 100 radially outward of the second part 200. Outer extraction holes may be connected to an under pressure via a chamber in the body of the first part 100. Outer extraction holes may be used to remove gas from radially inward of the outer extraction holes. In the case of use of a shielding gas other than air (e.g. carbon dioxide) in the gas flow exiting the exits 60a-e, outer extraction holes are desirable. Use of outer extraction holes can ensure that the environment of the lithographic apparatus is not contaminated with dangerous levels of shielding gas. Additionally allowing shielding gas to escape into the remainder of the lithographic apparatus may be undesirable as it may then reach optical paths of beams of radiation of imaging sensors and/or alignment sensors which can lead to errors in measurements made. In another embodiment outer extraction holes may be provided in the second part 200 and connected to an under pressure source in a similar way to discrete openings 50.

Figure 7:
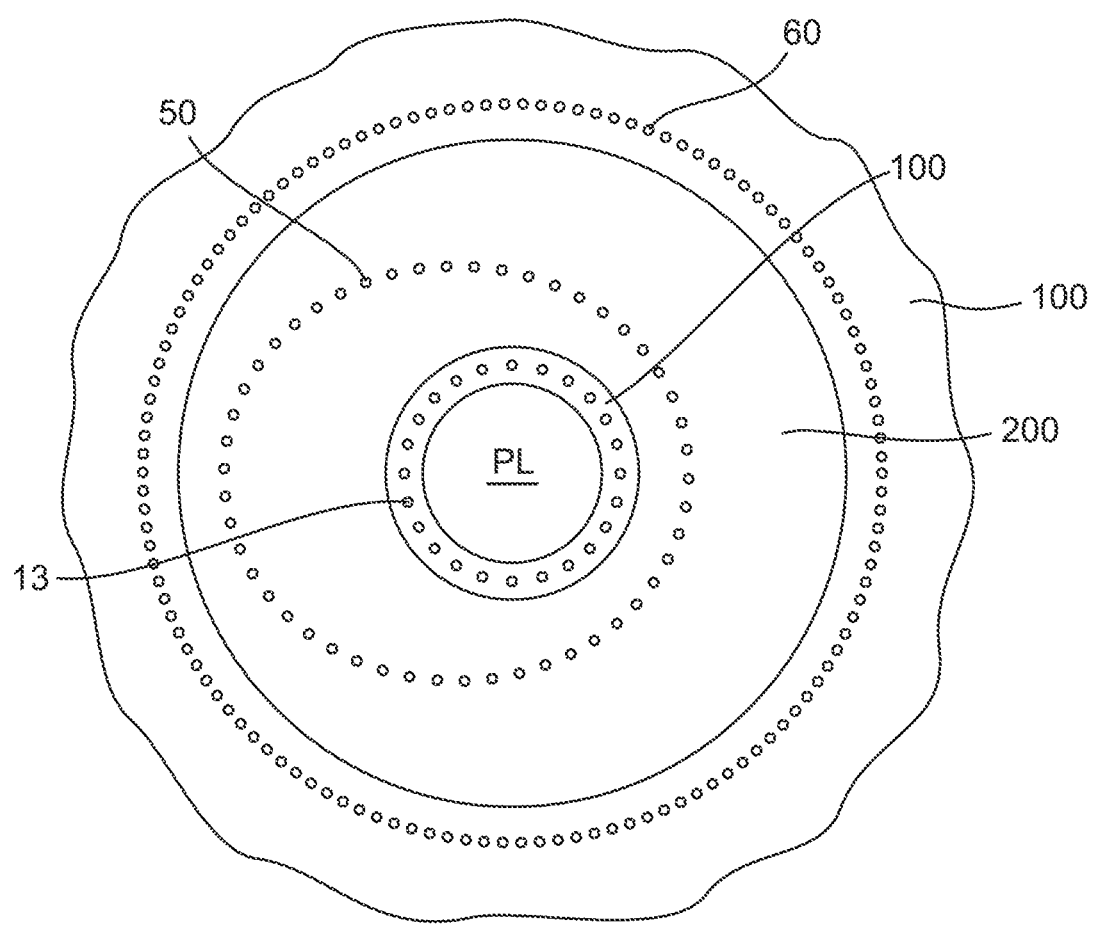
FIG. 7 is a plan view of a further fluid handling structure.
Figure 8:
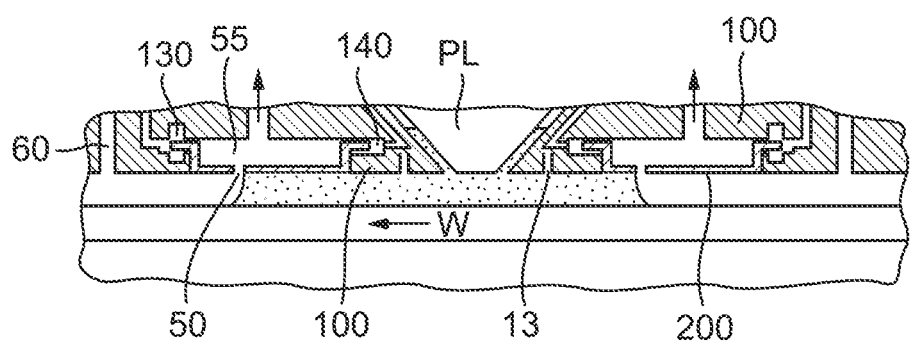
FIG. 8 is a cross-sectional view of one half of the FIG. 7 fluid handling structure.
Figure 9:
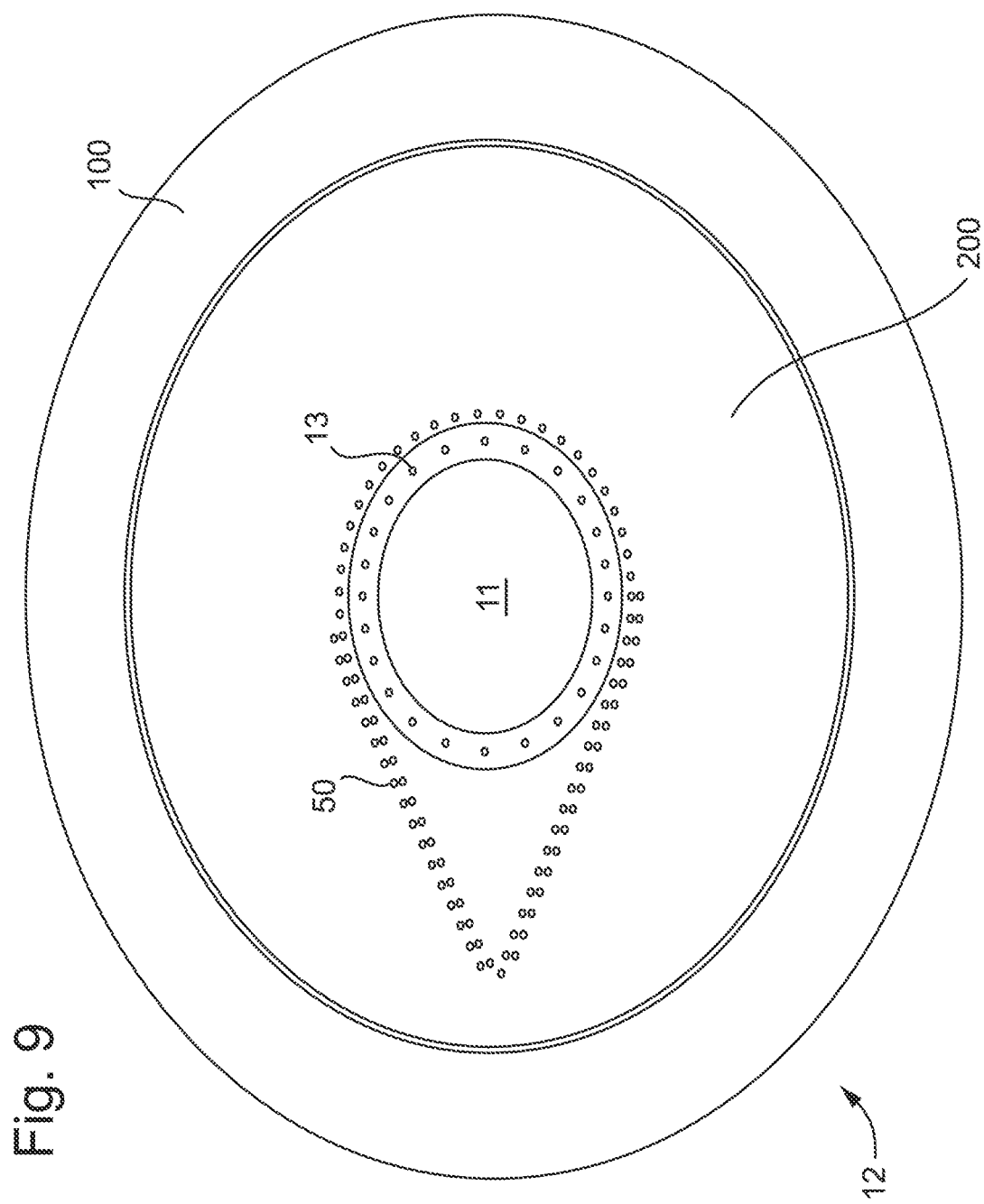
FIG. 9 is a perspective view of the under surface of a further fluid handling structure.

FIGS. 7-9 show alternative embodiments which work on similar principles to those of the embodiments of FIGS. 4-6. The embodiments of FIGS. 7-9 are the same as the embodiments of FIGS. 4-6 except as described below. In the embodiments of FIGS. 7-9 the inlet openings 13 and exits 60 are formed in the first part 100. The discrete openings 50 are formed in the second part 200. As with all other embodiments, the exact openings which are provided in the first part 100 and which are provided in the second part 200 can vary from the arrangement illustrated. For example, the one or more of the inlet openings 13 and exits 60 may be provided in the rotating second part 200 instead of in the substantially stationary first part 100. Additionally, as with the embodiments of FIGS. 4-6, outer extraction openings may be provided radially outwardly of the exits 60, either in the stationary first part 100 or the rotating second part 200.

Although the embodiments of FIGS. 7-9 are explained in relation to the liquid confinement features being in the form of discrete openings 50, the same principle can be used with any type of liquid confinement features which produce a flow of fluid into or out of the surface 20.

As can be seen in FIGS. 7-9 the discrete openings 50 are formed in a non circular shape, in plan, surrounding the aperture 15. The shape is designed to reduce the relative speed of the substrate W to a line normal to the direction between adjacent discrete openings 50. This is effective to reduce the force on the meniscus 320 extending between the discrete openings 50 (rather like the shape of FIG. 3 does). Therefore the second part 200 can be rotated such that the shape is aligned in an optimised direction for the confinement of immersion liquid relative to the direction of travel of the substrate W under the fluid handling structure 12. This arrangement has the benefit over the embodiment of FIG. 3 in that the relative position of the first part 100 to the second part 200 can be adjusted continuously to optimise the orientation of the shape made by the discrete openings 50 relative to the changing direction of travel of the substrate W under the fluid handling structure 12. As in other embodiments, a controller 500 controls the movement of the first part 100 relative to the second part 200. This may be on the basis of a known route of the substrate W under the fluid handling structure 12 or may be alternatively or additionally be on the basis of a sensed direction of motion of the substrate W under the fluid handling structure 12.

The overall shape the discrete openings 50 of the embodiment of FIGS. 7 and 8 make in plan is an off axis ellipse or another (routing) optimized elongate shape. The shape the discrete openings 50 of the embodiment of FIG. 9 make in plan is one with a rounded leading edge and which is elongated towards a corner with substantially straight lines at the trailing edge. In both embodiments the number of discrete openings 50 per unit area or length may increase in the region of the trailing edge. These shapes work at the trailing edge on the same principles as the shape of the fluid handling structure 12 of FIG. 3. That is, the relative velocity of the substrate W moving under the fluid handling structure 12 is reduced relative to the direction perpendicular to a direction between adjacent discrete openings 50. As a result, the speed at which immersion liquid is no longer contained by the discrete openings 50 is increased.

Figure 10:
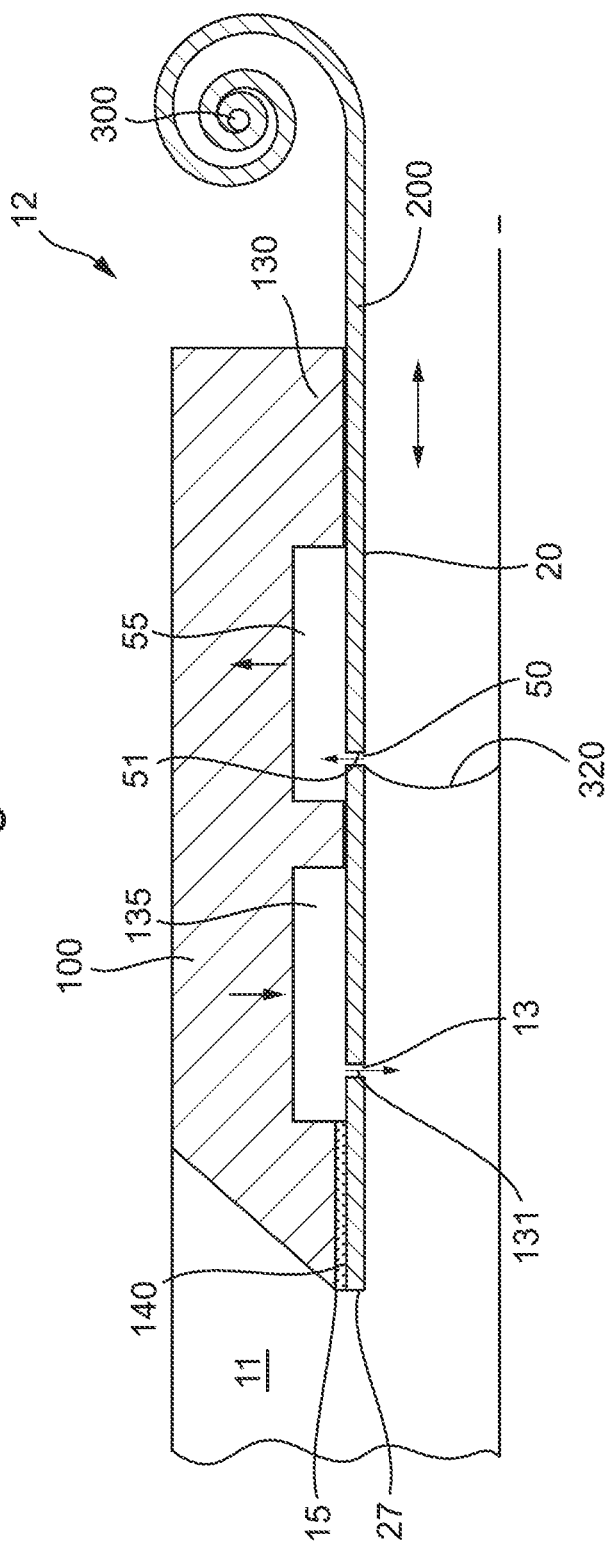
FIG. 10 is a side cross-sectional view of one half of a further fluid handling structure.

FIG. 10 shows a further embodiment which is the same as the foregoing embodiments except as described below. In the FIG. 10 embodiment the aperture 15 is defined by the first part 100.

In the embodiment of FIG. 10 the second part 200 is in the form of a plate. The second part 200 forms the entire surface 20. Any flows of fluid into or out of the surface 20 occur through the second part 200. For this purpose the second part 200 has a plurality of through holes 51, 131 in it. The through holes include through holes 131 for the liquid flow through liquid openings 13 and through holes 51 for the discrete openings 50 for the extraction of immersion liquid and gas thereby to pin the meniscus 320. An annular chamber 55 is provided above the discrete openings 50 like in the foregoing embodiments. Another annular chamber 135 is provided above the liquid openings 13 for the provision of immersion liquid through the liquid openings 13. The annular chamber 135 works on the same principles as the other annular chambers described herein.

The second part 200 is translatable in a plane relative to the first part 100. The plane in which the second part 200 is movable is a plane substantially parallel to the substrate W. The plane is also parallel to the plane of the surface 20.

Figure 11:
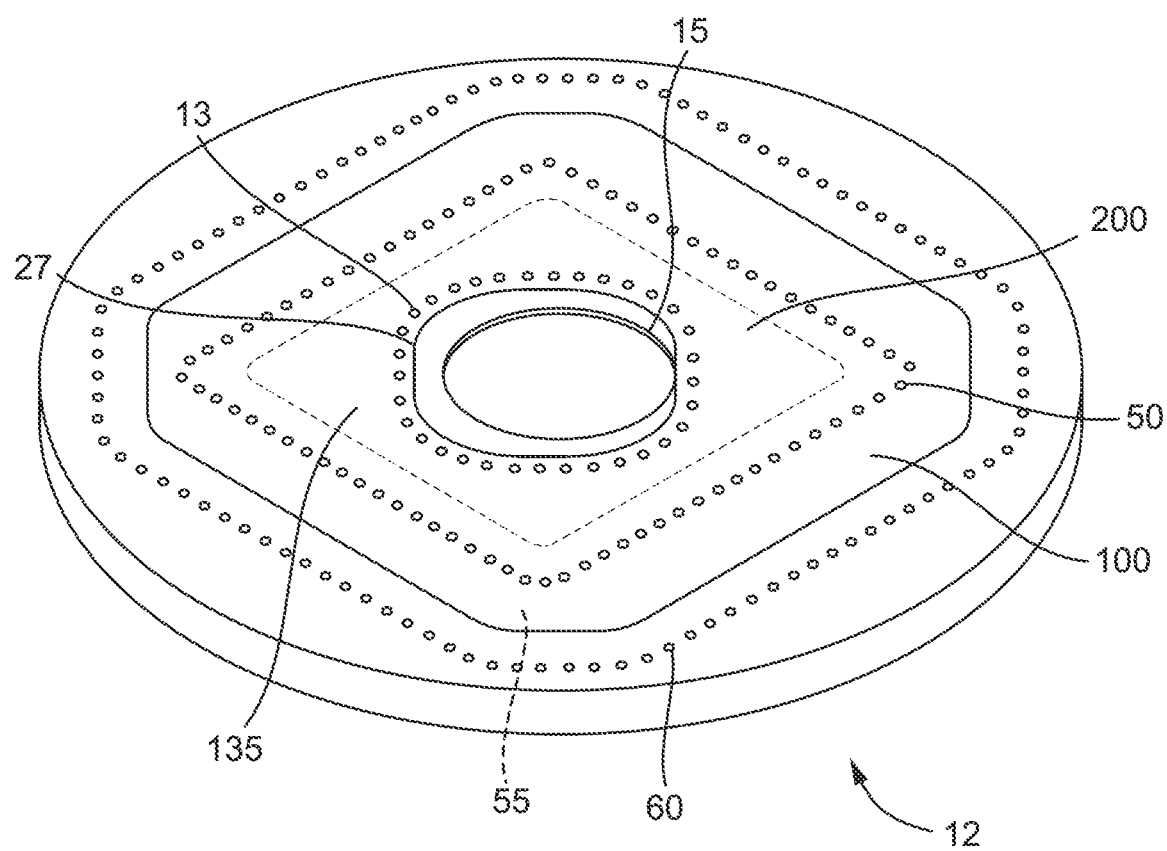
FIG. 11 is a perspective view of the under surface of a further fluid handling structure.

The second part 200 has an aperture 27 in it radially inwardly of the liquid openings 13. The aperture 27 in the second part 200 is larger than the aperture 15 in the first part 100. This allows movement of the second part 200 relative to the first part 100 without the second part 200 blocking the aperture 15 through which the projection beam passes to image the substrate W. This can most clearly be seen in the embodiment of FIG. 11, which is similar in this respect. The aperture 27 in the second part 200 may be of any shape. In the embodiment of FIG. 11 the shape is, in plan, a rounded square. This shape is chosen as it allows an extent of movement of the second part 200 relative to the first part 100 as desired without the second part 200 blocking the aperture 15 of the first part 100.

The annular chambers 55, 135 may be seen as having an opening in the first part 100 like in the FIG. 6 embodiment. The openings of the annular chamber 55, 135 and the through holes 51, 131 are in fluid communication when aligned. Relative movement of the second part 200 to the first part 100 results in movement of the through holes 51, 131 relative to the aperture 15. In this way the position of the fluid flow into or out of the surface 20 (i.e. out of liquid openings 13 and into discrete openings 50) changes relative to the aperture 15.

In the embodiment of FIG. 10 the cross-sectional area of the at least one through hole 131, 51 is smaller than the cross-sectional area of the openings of the annular chambers 135, 55. This allows relative movement of the second part 200 to the first part 100, thereby moving the position of the through holes 131, 51 relative to the aperture 15 of the first part 100. This movement is achieved whilst maintaining fluid communication between the annular chambers 135, 55 and their associated through holes 131, 51. In this way a constant flow of fluid into or out of the through holes 131, 51 between the fluid handling structure 12 and the substrate W is possible.

In the embodiment of FIG. 10 a bearing is provided between the first part 100 and the second part 200. The bearing may be a frictionless bearing. In one embodiment the bearing is a fluid bearing, for example a liquid bearing or a gas bearing. In a preferred embodiment a radially inward bearing 140 is a liquid bearing. The liquid bearing may use the same liquid as is provided to the immersion space 11. This has the advantage that any leaking of immersion liquid from the bearing 140 into the space 11 or the annular chamber 135 is not deleterious to the immersion liquid in the space 11.

A radially outward bearing 130 may be a gas or a liquid bearing. In a preferred embodiment the radially outward bearing 130 is a gas bearing. This is particularly preferred if a further through hole is provided in the second part 200 radially outwardly of the discrete openings 50 for the provision of a gas knife flow of gas onto the substrate W (similar to the embodiment of FIG. 3). The same gas as provided to that gas flow could then be used in the radially outward bearing 130.

In the embodiment of FIG. 10, the controller 500 moves the second part 200 in the same direction relative to the first part 100 as the substrate W moves relative to the first part 100. This results in a reduction in the relative velocity between the second part 200 and the substrate W compared to the case where no relative movement between the first part 100 and second part 200 occurs. This reduction in relative velocity between the second part 200 and the substrate W means that the meniscus 320 is more stable and loss of immersion liquid is less likely.

The relative movement of the second part 200 relative to the first part 100 may be achieved in any way. In the embodiment of FIG. 10 movement in one direction is achieved by rolling up the second part 200 at one edge. This is achieved by providing an axle 300 around which the second part 200 is wound. By driving the axle 300 (and a corresponding axle on the opposite side of the fluid handling structure 12 in the opposite direction) movement in one direction is achievable. Movement in the direction perpendicular to the axis of the axle 300 can be achieved by moving the axle 300 along the axle's longitudinal axis.

In the embodiment of FIG. 11 a different mechanism to achieve relative movement between the second part 200 and the first part 100 is utilized. These can be used in any other embodiment including the embodiment of FIG. 10 in place of the rolling up feature. The actuation may be by use of (linearly) actuated rods or wires, by use of a linear motor (actuator) or in any other way. The use of linear actuators gives more design freedom, lower risk of a generation of unwanted particles and better control and more accurate movements. In the case of two or three linear actuators being connected to the second part 200 by rods, the moving mass of the second part 200 is minimised (compared to the rolling up embodiment illustrated in FIG. 10).

In the embodiment of FIG. 11 exits 60 for the flow of gas there through may be provided in the bottom surface of the first part 100 and so are fixed in relation to the aperture 15. Thus, the surface 20 is defined by both the first part 100 and the second part 200, like in the embodiment of FIG. 4.

The embodiments of FIGS. 10 and 11 are advantageous because of the low mass of the moving part. That is, the plate which forms the second part 200 can be made relatively thin meaning that low forces are required to accelerate and decelerate it.

Although the embodiments of FIGS. 10 and 11 are illustrated with liquid openings 13 for the provision of immersion liquid there through and discrete openings 50 for the extraction of immersion liquid and gas, other openings and exits may be provided in the second part 200 (with a corresponding chamber). For example outer extraction openings can be provided.

Figure 12:
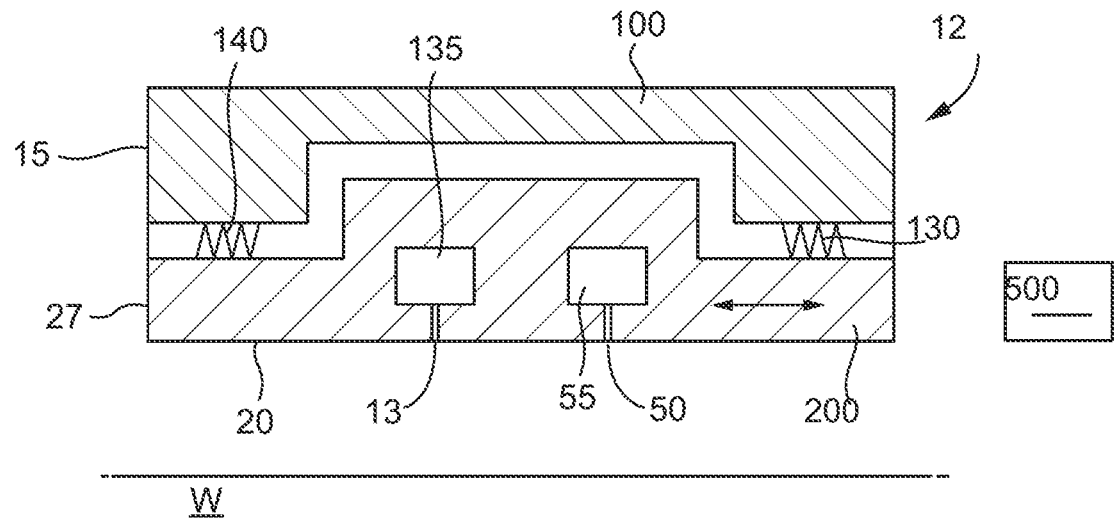
FIG. 12 is a side cross-sectional view that depicts one half of a further fluid handling structure.

Another embodiment is illustrated schematically in FIG. 12. The embodiment of FIG. 12 is the same as the FIGS. 10 and 11 embodiments except as described below.

In the embodiment of FIG. 12 instead of forming the annual chambers 135, 55 in the first part 100, these are formed in the second part 200. Like in the foregoing embodiments, any number of openings 13, 50 and exits 60 for a flow of fluid into and/or out of the surface 20 is possible but only openings 13 and 50 are illustrated in FIG. 12 for simplicity. In the embodiment illustrated in FIG. 12 a liquid opening 13 for the provision of immersion fluid there out is illustrated as well as a discrete opening 50 for the extraction of immersion liquid and gas from under the fluid handling structure 12.

In the embodiment of FIG. 12 fluid may be provided to and extracted from the annular chambers 135, 55 through hoses extending between the first part 100 and the second part 200. As a result, any bearing between the first part 100 and second part 200 has lower requirements than in the foregoing embodiments as it does not need to be fluid tight. Therefore the design is simplified compared to the embodiments of FIGS. 4-9, at the expense of increased mass of the second part 200 which moves relative to the substantially stationary first part 100.

The embodiment of FIG. 12 has the advantage that there are no moving parts except for the inner bearing 140 (which is optional) in fluid communication with immersion fluid in the region. Therefore, particles which might be generated by two surfaces moving relative to each other cannot find their way into the immersion space (on the left hand side of FIG. 12).

Figure 13:
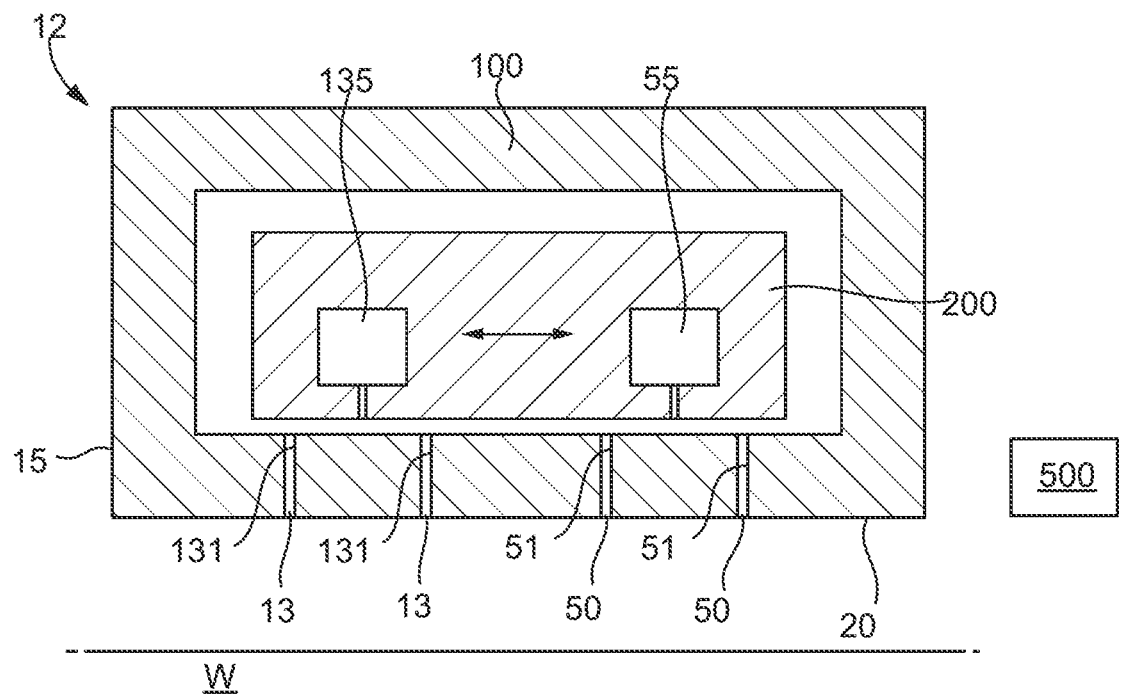
FIG. 13 is a side cross-sectional view that depicts one half of a further fluid handling structure.

The embodiment of FIG. 13 is the same as the foregoing embodiment except as described below. In the embodiment of FIG. 13 the liquid openings 13 and discrete openings 50 (and exits 60, not illustrated) are provided in the first part 100. The liquid openings 13 and discrete openings 50 (and exits 60) are connected to through holes 131, 51 through the first part 100. The movable second part 200 is in a cavity in the first part 100 and moves relative to the through holes 131, 51 and they are brought into selected fluid communication with annular chambers 135, 55 in the second part 200. In an embodiment, the annular chambers 135, 55 have openings with a cross sectional area similar to that of the through holes 131, 51 in the first part 100. In another embodiment, the openings of the annular chambers 135, 55 may be in the form of a slit. Thereby by relative movement of the second part 200 to the first part 100 it is possible to select which of the through holes 131, 51 in the first part 100 are in fluid communication with the annular chambers 135, 55 and so have a fluid flow through them. As a result it is possible to change the position of fluid flow into or out of the surface 20 relative to the aperture 15 by changing which of the liquid openings 13 and discrete openings 50 are in fluid communication with the annular chambers 135, 55.

For instance, if the second part 200 is moved relative to the first part 100 to the left as illustrated, the left hand most through hole 131 with corresponding opening 13 will be in fluid communication with the inner annular chamber 135 and the inner most discrete opening 50 will be in fluid communication with the outer annular chamber 55. However, the outer liquid opening 13 and outer discrete opening 50 will not be in fluid communication with their respective annular chambers 135, 55 and will therefore have no fluid flow through them.

If the second part 200 is now moved to the right relative to the first part 100, the outer through hole 131 with corresponding liquid opening 13 and outer through hole 51 with corresponding discrete opening 50 will be in fluid communication with the respective annular chamber 135, 55 such that the position of the flow (of immersion liquid) out of the fluid handling structure 12 will have moved radially outwardly with respect to the aperture 15 and the position at which extraction of immersion liquid and gas occurs through the openings 50 will also have moved radially outwardly with respect to the aperture 15.

In one embodiment an array of one or both sets of through holes 131, 51 may be provided through the first part 100. The through holes 131, 51 may be in the form, for example, of a microsieve. In a microsieve through holes are, for example, of a size of the order of 20 µm with a pitch of 30 µm. Therefore by relative movement of the second part 200 to the first part 100, an almost infinite number of different positions of the fluid flow into or out of the surface 20 can be achieved. This is because the passage leading from the annular chambers 135, 55 can be aligned with any of the through holes in the micro sieve so that it is possible to choose which of the through holes of the micro sieve have a fluid flow through them. Such an arrangement is advantageous as it is possible to vary the distances of extraction of fluid and/or provision of fluid relative to the aperture 15 smoothly depending upon the direction and speed of movement of the substrate W under the fluid handling structure 12.

Figure 14:
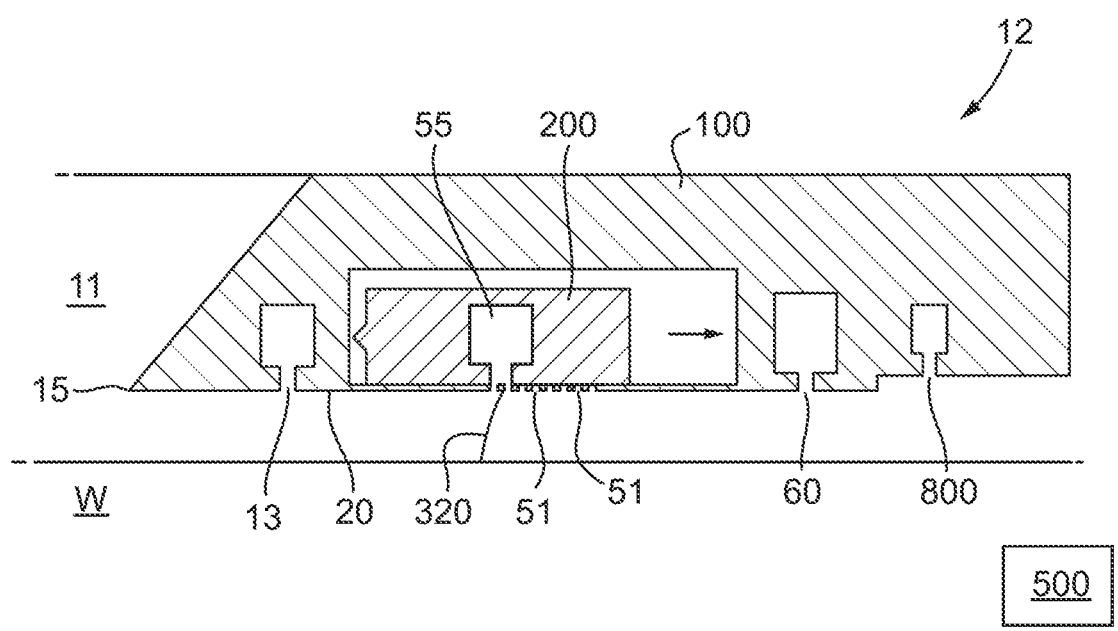
FIG. 14 is a side cross-sectional view that depicts one half of a further fluid handling structure.

FIG. 14 illustrates an embodiment which is the same as FIG. 13 except as described below. In the embodiment of FIG. 14 the liquid openings 13, exits 60 and outer extraction openings 800 are formed in the first part 100 and are therefore fixed in position relative to the aperture 15. The extraction openings 800 are illustrated as being in a surface which is in a plane further from the substrate W that the plane of surface 20. This need not be the case. In an embodiment extraction openings 800 could be formed in surface 20. The discreet openings are formed by a microsieve with a plurality of through holes 51. The second part 200 sits in a cavity in the first part 100 and moves relative to the through holes 51. The through holes 51 are brought into selected fluid communication with the annular chamber 55 in the second part 200. In this way the radial position at which immersion liquid and/or gas is/are extracted from between the fluid handling structure 12 and the substrate W can be moved.

In all embodiments, use of a controller 500 to control the relative positions of the first part 100 to the second part 200 may be used to optimise the positions of the fluid flows into and/or out of the surface 20 thereby to increase the maximum relative speed between the projection system PS and the substrate W before immersion liquid leaks from the region.

Other arrangements which are a combination of the above mentioned embodiments are possible. For example, the fluid handling structure 12 may comprise a third part (not illustrated), for example as the bottom of the first part 100 in the embodiment of FIG. 13 which is then movable relative to the second part 200. In this way a wider range of motion is achievable allowing the relative speed between the projection system PS and the substrate W and/or support table WT and thereby even higher throughput.

In an embodiment, there is provided a fluid handling structure configured to confine immersion fluid to a region of a lithographic apparatus, the fluid handling structure comprising: an aperture formed therein for the passage there through of a projection beam through the immersion fluid; a first part; and a second part, wherein at least one of the first part and the second part define a surface adapted for the extraction of immersion fluid from the region, wherein the fluid handling structure is adapted to provide a fluid flow into or out of the surface of the fluid handling structure, wherein movement of the first part relative to the second part is effective to change a position of the fluid flow into or out of the surface relative to the aperture, and wherein one of the first part and second part comprises at least one through-hole for the fluid flow there through and the other of the first part and second part comprises at least one opening for the fluid flow there through, the at least one through-hole and at least one opening being in fluid communication when aligned, the movement allowing alignment of the at least one opening with one of the at least one through-hole thereby to change the position of the fluid flow into or out of the surface relative to the aperture.

In an embodiment, the movement includes a rotational movement of the first part relative to the second part. In an embodiment, the fluid flow is a fluid flow of gas out of at least one outlet opening in the surface, the at least one outlet opening being an outlet opening of the at least one through-hole. In an embodiment, the at least one outlet opening is arranged such that the fluid flow passes out of the surface along a line, in plan, and the fluid flow is effective to manipulate droplets of the immersion fluid towards the aperture due to the change in position of the fluid flow. In an embodiment, the fluid handling structure further comprises at least one inlet opening in the surface for the extraction of the immersion fluid, the at least one inlet opening being closer to the aperture than the at least one outlet opening. In an embodiment, the at least one inlet opening is in the first part and the at least one outlet opening is in the second part and the surface is defined by substantially co-planar surfaces of the first part and the second part. In an embodiment, the fluid flow is a fluid flow of fluid into at least one inlet opening in the surface for the extraction of the immersion liquid, the at least one inlet opening being an inlet opening of the at least one through-hole. In an embodiment, the fluid flow into or out of the surface forms an area thereon in plan and has a shape thereon surrounding the aperture. In an embodiment, the shape is asymmetrical with respect to an axis of the projection beam passing through the aperture. In an embodiment, the second part defines the surface and the first part is positioned on a side of the second part opposite the surface. In an embodiment, the first part defines the surface and the second part is positioned in a cavity in the first part. In an embodiment, a cross-sectional area of the at least one through-hole is smaller than a cross-sectional area of the at least one opening and the at least one through-hole is in the surface such that by moving the second part relative to the aperture, the position of the through-hole relative to the aperture is changed, whilst the at least one opening and at least one through-hole remain in fluid communication. In an embodiment, the first part comprises a plate and a liquid bearing exists between the first part and the second part. In an embodiment, the first part is adapted to be moved relative to the second part by being rolled up at one edge. In an embodiment, the first part comprises a plurality of said through-holes and movement of the first part relative to the second part allows the at least one opening to align with different through-holes such that the through-hole through which the fluid flow passes can be changed thereby to change the position of the fluid flow into or out of the surface relative to the aperture. In an embodiment, the plurality of through-holes comprises a two-dimensional array of through-holes and the at least one opening is elongate such that the opening can be aligned and in fluid communication with a plurality of adjacent through-holes of the two dimensional array. In an embodiment, the fluid handling structure further comprises a third part, wherein both the first part and the second part are moveable relative to the third part.

In an embodiment, there is provided an immersion lithographic apparatus comprising the fluid handling system described herein. In an embodiment, the immersion lithographic apparatus further comprises a projection system for projecting the projection beam through the immersion fluid confined to the region by the fluid handing structure onto a substrate supported on a support table. In an embodiment, the immersion lithographic apparatus further comprises a controller for controlling movement of the first part relative to the second part during movement of the support table relative to the projection system such that a relative speed between the fluid flow and the substrate is lower than would be the case with no movement of the first part relative to the second part.

As will be appreciated, any of the above-described features can be used with any other feature and it is not only those combinations explicitly described which are covered in this application.

As will be appreciated, any of the above-described features can be used with any other feature and it is not only those combinations explicitly described which are covered in this application. For example, an embodiment of the invention could be applied to the embodiment of FIG. 3.

The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A fluid handling structure configured to confine immersion fluid to a region of a lithographic apparatus, the fluid handling structure comprising:
   an aperture formed therein for the passage therethrough of a projection beam through the immersion fluid;
   a first part; and
   a second part,
   wherein the first and/or second part defines a surface adapted for the extraction of immersion fluid from the region,
   wherein the fluid handling structure is adapted to provide a fluid flow into or out of the surface of the fluid handling structure,
   wherein relative movement between the first part and the second part is effective to change a position of the fluid flow into or out of the surface relative to the aperture,
   wherein one of the first or second part comprises at least one through-hole for the fluid flow therethrough and the other of the first or second part comprises at least one opening for the fluid flow therethrough, the at least one through-hole and at least one opening being in fluid communication when aligned, the relative movement allowing alignment of at least one opening of the at least one opening with at least one through-hole of the at least one through-hole to change the position of the fluid flow into or out of the surface relative to the aperture, and wherein the fluid flow comprises a fluid flow of fluid out of at least one outlet opening in the surface, the at least one outlet opening being an outlet opening of at least one through-hole and a fluid flow of fluid into at least one inlet opening in the surface for the extraction of immersion fluid, the at least one inlet opening being an inlet opening of at least one through-hole.

2. The fluid handling structure of claim 1, wherein the relative movement includes a rotational movement between the first part and the second part.

3. The fluid handling structure of claim 1, wherein the at least one outlet opening is arranged such that the fluid flow passes out of the surface along a line, in plan, and the fluid flow is effective to manipulate droplets of immersion fluid towards the aperture due to the change in position of the fluid flow.

4. The fluid handling structure of claim 1, wherein the at least one inlet opening in the surface is closer to the aperture than the at least one outlet opening.

5. The fluid handling structure of claim 1, wherein the at least one inlet opening is in the first part and the at least one outlet opening is in the second part and the surface is defined by substantially co-planar surfaces of the first part and the second part.

6. The fluid handling structure of claim 1, wherein the fluid flow into or out of the surface forms an area thereon in plan and has a shape surrounding the aperture.

7. An immersion lithographic apparatus comprising:
the fluid handling system of claim 1; and
a projection system configured to project the projection beam through the immersion fluid confined to the region by the fluid handing structure onto a substrate supported on a support table.

8. A fluid handling structure configured to confine immersion fluid to a region of a lithographic apparatus, the fluid handling structure comprising:
an aperture formed therein for the passage therethrough of a projection beam through the immersion fluid;
a first part; and
a second part,
wherein the first and/or second part defines a surface adapted for the extraction of immersion fluid from the region,
wherein the fluid handling structure is adapted to provide a fluid flow into or out of the surface of the fluid handling structure,
wherein relative movement between the first part and the second part is effective to change a position of the fluid flow into or out of the surface relative to the aperture,
wherein one of the first or second part comprises at least one through-hole for the fluid flow therethrough and the other of the first or second part comprises at least one opening for the fluid flow therethrough, the at least one through-hole and at least one opening being in fluid communication when aligned, the relative movement allowing alignment of at least one opening of the at least one opening with at least one through-hole of the at least one through-hole to change the position of the fluid flow into or out of the surface relative to the aperture, and
wherein the at least opening is defined by an annular chamber provided above the at least one through-hole and the annular chamber has a relatively large volume compared to the total volume of the at least one through-hole.

9. The fluid handling structure of claim 8, wherein the relative movement includes a rotational movement between the first part and the second part.

10. The fluid handling structure of claim 8, wherein the fluid flow is a fluid flow out of at least one outlet opening in the surface, the at least one outlet opening being an outlet opening of the at least one through-hole.

11. The fluid handling structure of claim 10, wherein the at least one outlet opening is arranged such that the fluid flow passes out of the surface along a line, in plan, and the fluid flow is effective to manipulate droplets of immersion fluid towards the aperture due to the change in position of the fluid flow.

12. The fluid handling structure of claim 8, wherein the fluid flow is a fluid flow into at least one inlet opening in the surface for extraction of immersion fluid, the at least one inlet opening being an inlet opening of the at least one through-hole.

13. The fluid handling structure of claim 8, wherein the fluid flow into or out of the surface forms an area thereon in plan and has a shape surrounding the aperture.

14. An immersion lithographic apparatus comprising:
the fluid handling system of claim 8; and
a projection system configured to project the projection beam through the immersion fluid confined to the region by the fluid handing structure onto a substrate supported on a support table.

15. A fluid handling structure configured to confine immersion fluid to a region of a lithographic apparatus, the fluid handling structure comprising:
a first part defining an aperture formed therein for the passage therethrough of a projection beam through the immersion fluid;
a second part defining a surface configured to supply and/or extract immersion fluid from the region; and
a bearing arranged between the first part and the second part,
wherein the second part comprises at least one through-hole configured to provide a fluid into or out of the surface of the fluid handling structure and a chamber being in fluid communication with the at least one through-hole, and
wherein relative movement between the first and second parts changes a position of the fluid flow into or out of the surface relative to the aperture.

16. The fluid handling structure of claim 15, wherein the relative movement includes a rotational movement between the first part and the second part.

17. The fluid handling structure of claim 15, wherein the fluid flow is a fluid flow out of at least one outlet opening in the surface, the at least one outlet opening being an outlet opening of the at least one through-hole.

18. The fluid handling structure of claim 15, wherein the fluid flow is a fluid flow into at least one inlet opening in the surface for extraction of immersion fluid, the at least one inlet opening being an inlet opening of the at least one through-hole.

19. The fluid handling structure of claim 15, wherein the fluid flow into or out of the surface forms an area thereon in plan and has a shape surrounding the aperture.

20. An immersion lithographic apparatus comprising:
the fluid handling system of claim 15; and
a projection system configured to project the projection beam through the immersion fluid confined to the region by the fluid handing structure onto a substrate supported on a support table.

* * * * *